United States Patent [19]

Keren

[11] Patent Number: 4,906,933

[45] Date of Patent: Mar. 6, 1990

[54] QUADRATURE SURFACE COIL

[75] Inventor: Hanan Keren, Kfar Saba, Israel

[73] Assignee: Elscint Ltd., Haifa, Israel

[21] Appl. No.: 321,885

[22] Filed: Mar. 10, 1989

[30] Foreign Application Priority Data

Mar. 18, 1988 [IL] Israel ................................. 85785

[51] Int. Cl.[4] ............................................. G01R 33/20
[52] U.S. Cl. .................................... 324/318; 324/322; 333/219
[58] Field of Search ............... 324/300, 307, 309, 318, 324/319, 320, 322; 333/12, 219

[56] References Cited

U.S. PATENT DOCUMENTS 4,812,764  3/1989  Bendall ............................ 324/322
4,816,765  3/1989  Boskamp .......................... 324/322

OTHER PUBLICATIONS

"An Efficient Highly Homogeneous RF Coil for Whole Body Imaging at 1.5T" by C. E. Hayes et al., Journal of Magnetic Resonance; pp. 622–628; 1985.
"Quadrature Detection Surface Coils" by James S. Hyde et al., Magnetic Resonance in Medicine, pp. 179–184; 1985.
"Quadrature Detection in the Laboratory Frame" D. I. Hoult et al., Magnetic Resonance in Medicine; pp. 339–353; 1984.

Primary Examiner—Michael J. Tokar
Attorney, Agent, or Firm—Sandler & Greenblum

[57] ABSTRACT

A surface coil arrangement for magnetic resonance data acquisition comprising a first coil designed to generate a circular magnetic field and a second coil designed to generate a linear magnetic field in quadrature to said circular magnetic field with said first and second coils positioned relative to one another to provide circular polarization.

7 Claims, 4 Drawing Sheets

QUADRATURE SURFACE COIL

FIELD OF INVENTION

This invention is concerned with magnetic resonance systems including magnetic resonance spectroscopy and imaging systems and more particularly with radio frequency probes used in such systems.

BACKGROUND OF THE INVENTION

Magnetic resonance systems acquire data using strong magnets for providing large static magnetic fields. Gradient coils within the magnet are provided to "focus" the magnetic fields. The gradient coils and the large static magnetic fields are used to magnetically align certain nuclei ("spins") in a desired plane of the sample being imaged or spectrographically studied. A radio frequency (RF) pulse is used to "tip" the aligned spins so that at least a projection of the tipped spins is in a plane orthogonal to the plane in which the spins are aligned. When the RF pulse terminates the nutated or tipped spins dephase and tend to return to the aligned condition. As the spins return to the aligned state the movement of the spins in the magnetic field generate what are known as "free induction decay" (FID) signals. It is the FID signals in one form or another that are used for imaging and spectrographic purposes.

Special RF coils or probes are used for transmitting RF pulses and/or receiving the FID signals. These probes are energized in the transmitting state with an RF pulse frequency known as the Larmor frequency which, as is well-known, is a function of the particular element and the strength of the magnetic field in which the element is located. The Larmor frequency is also the precessional angular frequency of the aligned nuclei (spins) and the frequency of the (FID) signals.

While many types of magnets can be used to generate the large static magnetic fields; in a preferred embodiment a superconducting magnet is used. The subject or patient is placed in the bore of the superconducting magnet for exposure to the large static magnetic field. The RF probes are either body probes, where the patient fits inside the probe or probes designed to be juxtaposed to particular portions of the body such as the spine, the limbs or the head.

The probes must be capable of:
resonating at the desired radio frequency;
generating homogeneous magnetic fields if used in the transmitting mode, and
not adding excessive noise to the signals received.

The probes designed to be juxtaposed to particular portions of the body are relatively efficient due to the proximity of the probe to the body part from which data is acquired.

Notwithstanding this relative efficiency of the proximate probes (including surface coils), the signal-to-noise ratio (SNR) of the acquired data remain critical because of the small amplitudes of the FID signals. The SNR decreases because, among other things, of imbalances in the surface coils due to stray capacitance and because of variations in the impedances of the probes when "loaded" by the patient. Different patients have different body impedances and, therefore, load the RF probes differently. Also, the human body is not symetrical - thus the loading is not symetrical and results in variations in the signals received from the probe.

Another serious problem faced by the scientists and the designers of MR systems is that the RF power transmitted by the probes may cause heating of the body sections being studied. The heating occurs because only a relatively small portion of the RF power tips the spin; most of the power generates eddy and dielectric currents in the tissue of the subject which in turn generate heat. This RF heating has caused the Federal Drug Administration (FDA) in the United States to set a limit on the specific power absorption rate (SAR) of the RF signal that can be used in imaging humans. The set limit is 0.4 watts per kilogram. Thus there is a limit on the power that can be used by RF probes that is a function of the patient's weight. The limit is designed to safeguard the patient from exposure to RF caused heat damage to tissues.

Most of the probes used in the past have been linearly polarized. For example, "saddle" shaped coils have been extensively used. Linearily polarized as used herein means that the fields provided by the probes are normal and remain normal to one of the planes defined by two of the orthogonal axes of the MR system. Generally, speaking the MR system is considered as an XYZ orthogonal systems with the large static magnetic field in the Z direction.

The RF field is assumed to be perpendicular to the XY plane. The spins precess around the Z axis for example, and the effective projection and linear polarization is in the XY plane.

When using linear polarization of the applied RF pulses only half of the RF power of the generated magnetic lines pass through the subject. Accordingly, only half of the RF power is effectively used, at best, to tip the spins.

Still another problem is that the presently available RF probes cause what are known as radio frequency penetration artifacts which appear on the body images as shaded areas. The artifacts result from standing waves of the RF radiation passing through the tissue at high frequencies which distort the uniformity of the applied radio frequency magnetic field. In an attempt to overcome this problem the prior art implemented an excitation mode wherein the polarization is "circular" rather than linear.

See an article entitled "An Efficient Highly Homogeneous RF Coil for Whole Body Imaging at 1.5T" by C. E. HAYES et al in the Journal of Magnetic Resonance, Vol. 163, pages 622–628 (1985). This mode is also sometimes referred to as a "Quadrature Mode". The circular polarization in addition to improving image quality, reduces the power required to achieve a given shift of the spins. The circular polarization decreases the necessary RF power by a factor of 2. Accordingly, smaller RF power amplifiers can be used.

Also as a synergistic benefit; less energy is absorbed by the patient; thereby reducing the problem of possibly exceeding the 0.4 Watts per Kg. SAR. The sensitivity of the receiver coils to the FID signals are also greater with circular polarization by an amount that increases the signal to noise ratio by a factor of the square root of 2.

However, there has been a serious drawback involved in the use of circular or quadrature mode equipment in that the homogenity of the generated RF field in the subject does not match the homogenity of the fields generated by the saddle coils.

A related problem with quadrature mode equipment has been the difficulty encountered in providing coils which can generate circularly polarized RF fields without being unduly influenced by the loading by the patient. Also, quadrature mode generating equipment is generally unduly influenced by the cross-coupling between the multiple coils that must be used to generate the circular polarization.

The prior art attempts at accomplishing circular polarization or quadrature excitation have been accomplished using multiple spaced-apart coils. The multiple spaced apart coils comprise either two coils at 90 degrees to each other, counter rotating current resonators, planar pair resonators or extremely complicated quadrature surface coils. See for example an article entitled "Quadrature Detection Surface Coils" by James S. Hyde et al, which appeared in the Journal of Magnetic Resonance in Medicine, Vol. 4, pages 179–184 (1987). See also an article entitled "Quadrature Detection in the Laboratory Frame" by D. I. Hoult et al, published in the Journal of Magnetic Resonance in Medicine, Vol. 1, pages 339–351 (1984) which teaches a plurality of overlapping saddle coils which theoretically can be used in quadrature. Implementation of the theory has proven extremely difficult.

Another problem related to the use of quadrature surface coils is that none of the known quadrature surface coils can be effectively used for imaging the spine. For example, when two separate coils, 90 degrees to each other, are used then only one of the coils can be placed proximate to the spine while the other coil is kept away from the spine by the subject's body. The distance of the subject's body in effect makes the second coil irrelevant to the imaging process. Thus, none of the presently available planar pair of resonators, the counter-rotating current resonators, or the quadrature surface coils are conducive to use in spinal imaging.

Accordingly scientists in the field are still seeking efficient quadrature surface probes for use in MR systems and especially for such probes which can be used for spinal imaging.

BRIEF DESCRIPTION OF THE INVENTION

Accordingly, it is an object of the present invention to provide circularily polarized RF surface coil arrangements for use in MR Systems having large static magnetic fields directed along a first axis, said coil arrangements comprising:
first coil means generating a circular magnetic field,
second coil means generating a linear magnetic field in quadrature to said circular magnetic field, and
said first and said second coil means being positioned relative to one another and being connected to provide circular polarization.

A feature of the invention is a surface probe comprising two separate coil means,
a first of said two separate coil means comprising:
a center conductor and two outer conductors,
the center conductor and the two outer conductors being joined together by two spaced apart conductors joining the center conductor to each of the outer conductors at spaced apart points on each of the said center conductor and outer conductors,
the second of the said two separate coil means comprising:
a loop including conductor means serially coupled through circuit elements,
the first and second coil means being substantially parallel and juxtaposed to each other,
means for connecting the first and second coil means to provide an induced field that rotates relative to a part of the subject being imaged whereby a polarized RF probe is provided that is ideal for imaging of spinal columns since the center conductor can be aligned parallel and proximate to the spinal column and the other conductors of each of the two coils will also be relatively proximate to the spinal column.

A further feature of the invention comprises first coil means having a center conductor said first coil means providing receive signals as a cosine function for example, while the received signals obtained from the second coil means are a sin function. This relationship of said first and second coil mean provides a vector sum that rotates about the center conductor of the first coil, for example, which is in the direction of the Z axis.

The invention enables a reduction by a factor of two of radiated power necessary to tip the spins, i.e. the radiated power produced by the surface coil of the MR Systems.

Another feature of the invention is in providing two coils which produce orthognal fields, even though they are both mounted, spaced apart by only a few millimeters on the opposite side of a planar section of plastic. Thus the surface probe can easily be inserted under the matress on which the patient rests in the bore of the magnet.

BRIEF DESCRIPTION OF THE DRAWINGS

The above mentioned and other features and objects of the present invention will be best understood when considered in the light of the following description of a broad aspect of the present invention made with reference to to the accompanying drawing of the improved RF surface probe; wherein.

GENERAL DESCRIPTION

Figure 1:
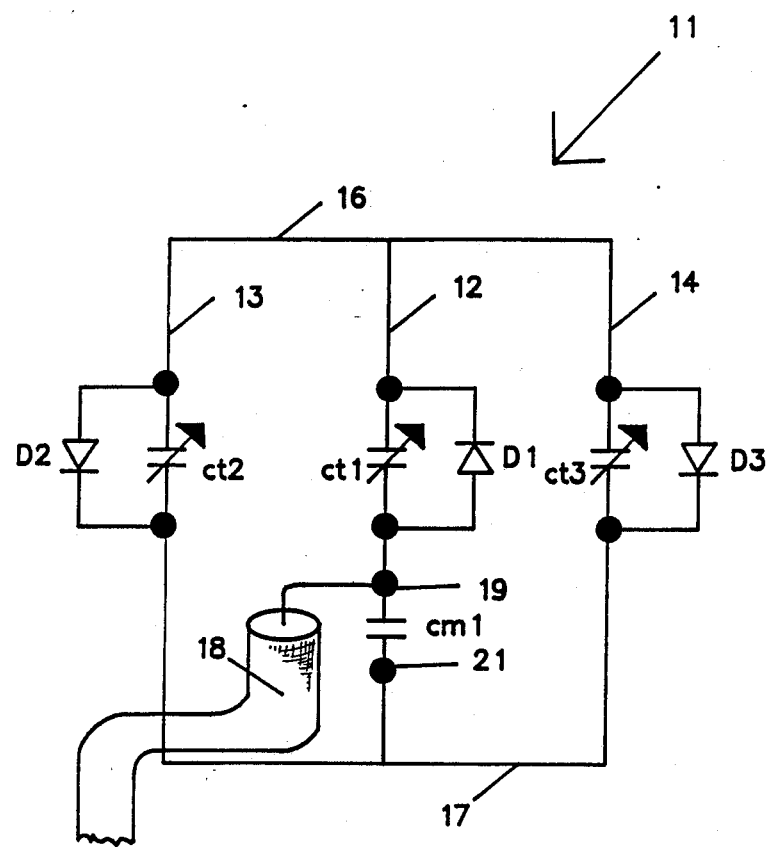
FIG. 1 is a schematic showing of a first coil in a two-coil surface probe.
Figure 3:
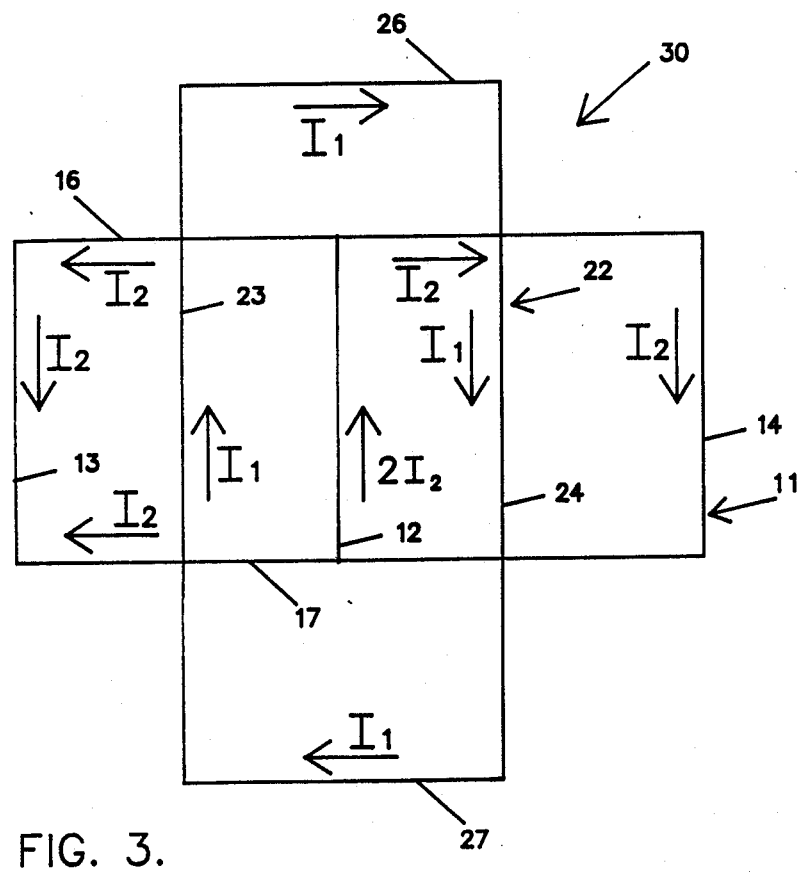
FIG. 3 shows the current flow in the first and the second coil of the inventive surface probe.

The coil 11 of FIG. 1 is a first coil of a two coil arrangement constituting the surface probe. The coil 11 is a means for generating a first RF magnetic field. Of course, surface probes generally are used only for receiving FID signals and not for transmitting RF pulses. However, since receiving and transmitting are reciprocal as far as coils are concerned the description often will use a transmitting mode for describing the operation of the surface probes. The FID signals, for example, generate a current I2 in the surface probe 11 which runs upward as shown in FIG. 3 in the center leg or conductor of the coil. It is the center leg of the coil which is arranged to be adjacent to the patient's spine that provides much of the enhancement to spinal images generated with the use of the inventive coil arrangement described herein.

The coil 11 comprises a coil having a center conductor 12 and two outer parallel legs or conductors 13 and 14. It is the center leg and the two outer legs which combine to generate the current I2 responsive to being "cut" by FID signals.

The conductors are joined together at the top and the bottom by transverse conductors 16 and 17 respectively. The conductors in actual use in a preferred embodiment are flat, tape conductors which act as iductors at the frequencies at which they are used in MR experiments. However, other types of conductors could be used within the scope of this invention.

The coil arrangement 11 has to be tuned to the different frequencies at which it receives FID signals from the subject. Accordingly, in each of the three legs of the coil arrangement a tuning capacitor is provided. Thus the center leg is shown as having a tuning capacitor CT1, the two outer legs are shown as having tuning capacitors CT2 and CT3, on the left outer leg and the right outer leg respectively. In addition the impedance of the coil 11 is adjusted for matching the line impedance of the system. In a preferred embodiment the line impedance is 50 ohms. A matching capacitor CM1 located in the middle leg of the coil arrangement is used for this purpose.

Means are provided for ensuring the isolation of this surface coil from the main body coil. More particularly each of the tuning capacitors is bridged by a diode. For example, capacitor CT1 is bridged by diode D1, capacitor CT2 is bridged by diode D2 and capacitor CT3 is bridged by diode D3. These diodes are selected so that they fire responsive to excitation of the RF body coil of the MR system. In other words, when there is excitation of the system by the main body coil, the surface coil also picks up the RF pulse and responsive thereto generates a current causing a counter magnetic field to exist. The counter magnetic field would be opposite in direction to the magnetic field of the main RF body coil and therefore would have an adverse affect on the homogenity and on the signal-to-noise ratio of the system. The diodes detune the coil responsive to the excitation of the RF pulses and prevent generation of opposite going magnetic fields by the surface coil.

Means are provided for coupling the coil arrangement 11 to the system. More particularly, a coxial cable 18 is shown. The center conductor of the coaxial cable is connected at point 19 of the center leg 12. The shielding of the coxial cable is connected to the center leg 12 at point 21 on the other side of the matching capacitor CM1.

In a preferred embodiment in a 1.9 Teslo static magnetic field, the length of transverse conductors 16 and 17 is 30 cm and the lengths of each of the legs is 20 cm. The values of the capacitors are as follows:
CT1=25 pfd
CT2=CT3=40 pfd
and CM1=100 pfd
The diodes used are:
D1=D2=D3=4010B pin diode, supplied by Unitrode Corp.

Figure 2:
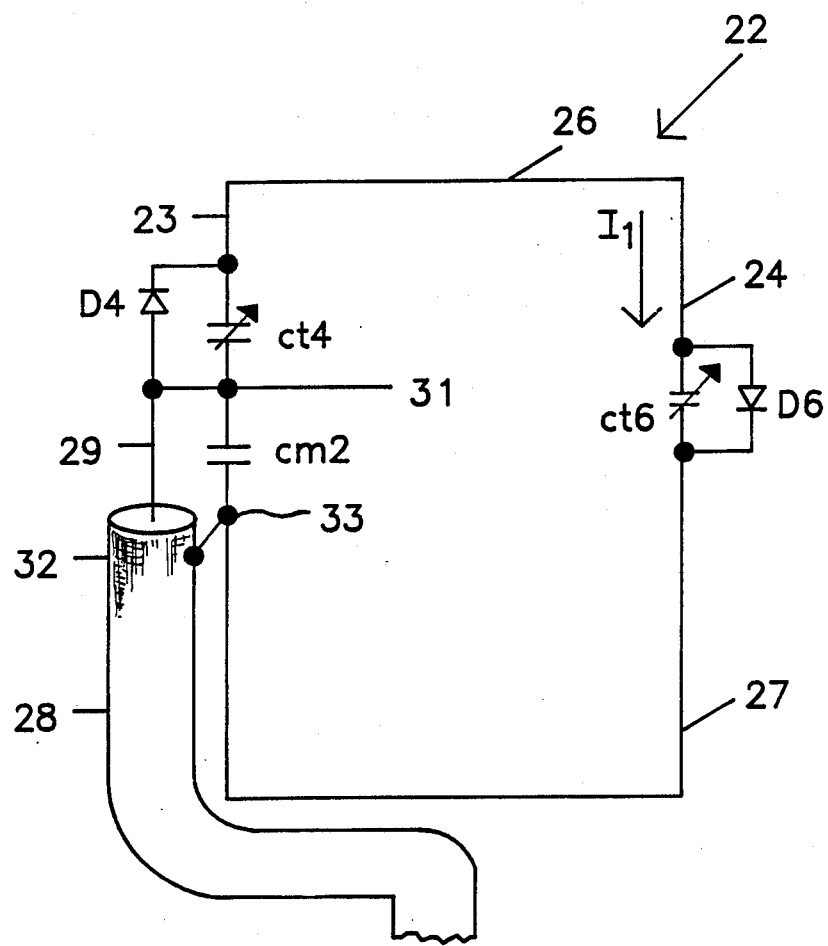
FIG. 2 is a schematic showing of the second coil of the surface probe.

The second coil of the probe shown in FIG. 2 comprises two outer conductors or legs 23 and 24. The outer conductors are connected at the top and bottom by transverse conductors 26 and 27 respectively. It is the outer legs 23 and 24 that are cut by the lines of the magnetic field generated by the FID or echo signal, which generates the current I1 that flows in the coil arrangement 22. The coil arrangement 22 responsive to the current I1 generates a magnetic field that is perpendicular to the plane of the coil arrangements. The coil 22, has a tuning capacitor in each of the legs. Thus, in the leg 23 there is a tuning capacitor CT4 and in the leg 24 there is a tuning capacitor CT6. The tuning capacitors are used to tune the coil to the desired Larmor frequency. The desired Larmor frequency is that generated by the responses of the spins being manipulated to the RF pulse of the body coil and the magnetic field intensity caused by the combination of the large static magnetic field and the gradient pulses of the test sequence being used.

Means are provided for isolating coil 22 during the excitation by the main body coil of the system. Here again diodes bridge the tuning capacitors to detune the coil during excitation. The diodes are shown as diode D4 bridging capacitor CT4 and diode D6 bridging capacitor CT6.

Means are provided for connecting the coil arrangement 22 to the system. More particularly, a coaxial cable 28 is shown. The center conductor 29 of the coil is connected at point 31 to leg 23 of the coil 22. The shielding of the cable 32 is connected at point 33 to the other side of the matching capacitor CM2. Point 31 is between the capacitor CT4 and capacitor CM2.

In a preferred embodiment in a 1.9 Tesla static magnetic field
CT4=25 pfd.
CT6=10 pfd
CM2=100 pfd
D4=D6=4010B pin diodes supplied by Unitrode Corp.

FIG. 3 shows how current flows in the two coils and how the coils are set one upon the other to make the probe 30. The coil 11 in the preferred embodiment is set on one side of the piece of plastic approximately 2 mm thick. The coil 22 is set on the other side of that piece of plastic so that the thickness of the piece of plastic separates coil 11 and coil 22. The currents I1 flowing in coil 22 are in the direction shown in FIG. 3. The currents I2 and 2I2 flow in the direction shown in FIG. 3. Of course, all of the currents can be shown flowing in the opposite directions.

Figure 5:
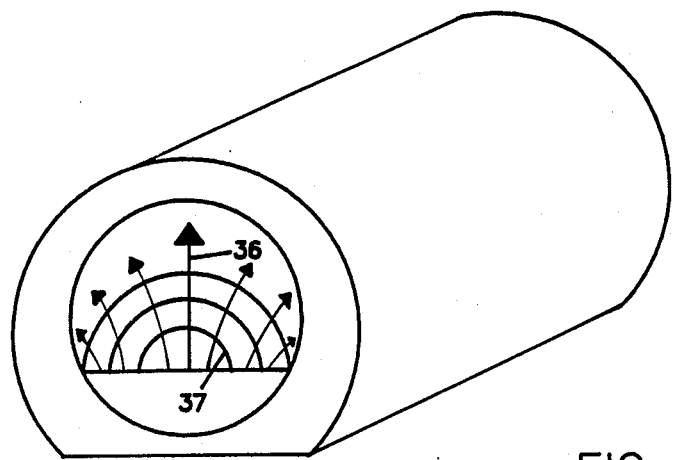
FIG. 5 shows the magnetic resonance fields induced in the two coils by the FID signals in the bore of the magnet.

The currents flowing as shown in coil arrangement 11 generate a magnetic field encircling the middle conductor leg 12. The magnetic field generated by the current I1 in coil 22 is basically normal to the plane of the coil 22. The combination of the two magnetic fields is shown in FIG. 5. The magnetic field of coil 22 is basically normal to the plane of the coil 22 as shown by the vertical lines, such as vertical line 36 and the lines parallel to line 36. Of course, each of the lines tends to become arcuate as it goes further from the coil. The circular magnetic field generated by coil 11 is shown by arcuate or circular lines, such as line 37. The combination of the two fields is a circular field or quadrature field.

In a preferred embodiment the leg 12 is placed under the patient's spine. Thus coil 11 is on the top of the piece of plastic and the coil arrangement 22 is underneath the piece of plastic. The patient lies on a matress which is placed immediately above the coil system. From FIG. 3 it can be understood that the important conductors that are cut by the FID signal are close to the section of the patient's body being imaged, i.e. conductor 12 is immediately under the spine and conductors 23 and 24 are close to the spine and accordingly an improved signal-to-noise ratio is obtained using the coil arrangement.

Figure 4:
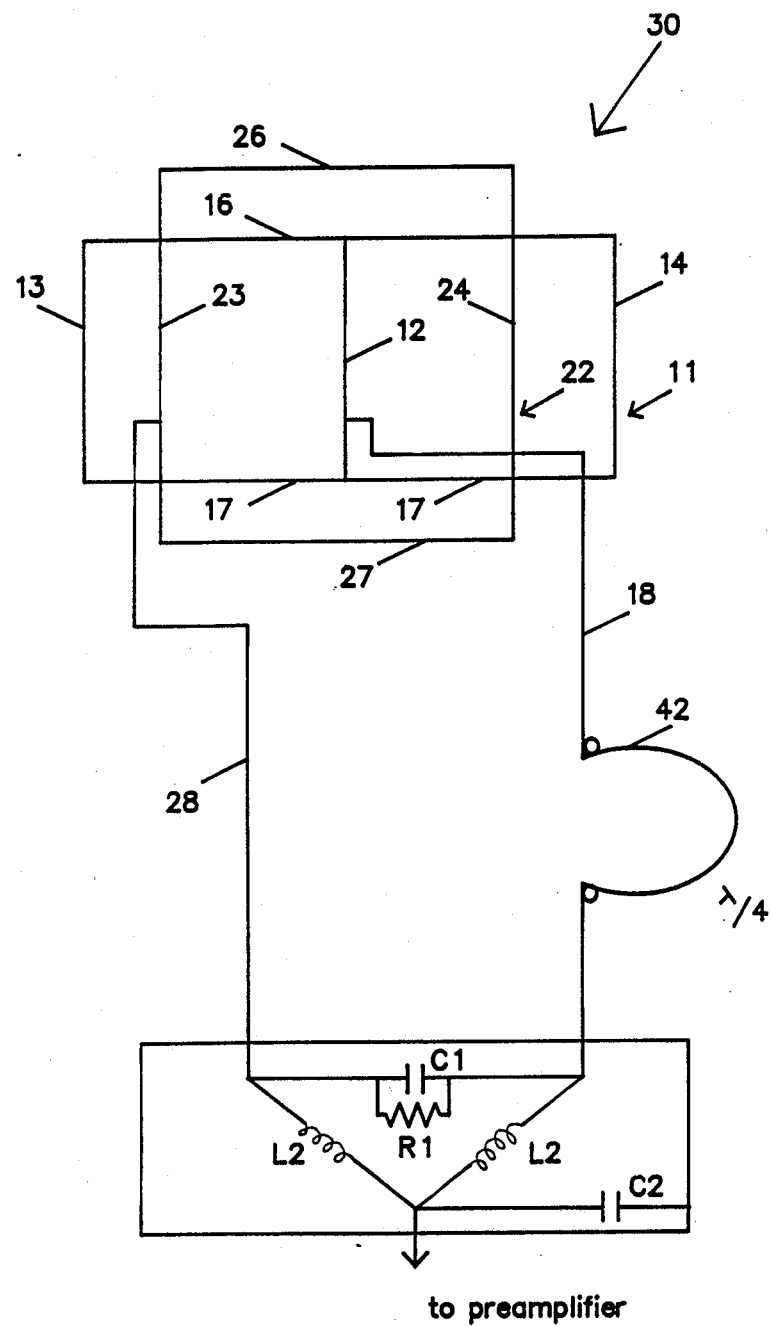
FIG. 4 shows the two coils connected to a hybrid combiner for obtaining a a quadrature output.

FIG. 4 shows how the coils are connected through a hybrid combiner to the preamplifier of the receiver system. Coil arrangement 11 is connected through coaxial cable 18 to the hybrid combiner 41. An extra quarter wave length (λ/4) section shown at 32 is connected between coil 11 and the hybrid combiner 41 to obtain a phase differentiation between the signal produced by coil 11 and the signal produced by coil 22. This assures quadrature operation of the coil arrangement system. Note that the coaxial cable 18 runs parallel with and adjacent to the middle leg 12 of coil 11 and then along the transverse bottom conductor 17 to minimize any mutual inductance between the coil 11 and the coaxial cable 18.

The coaxial cable 28 is shown connecting coil 22 to hybrid combiner 41. No quarter wave length sections appear in the connection of coil 22 and hybrid combiner 41. Thus a 90 degree phase shift exists between the signals of coil 11 and coil 22 coming into hybrid combiner 41.

The quarter wave length coaxial cable is one way of producing a phase-shift. It should be understood that other types of phase-shift arrangement could be used within the scope of the present invention.

The hybrid combiner is shown as having a hybrid loop comprised of a resistor R1 and two inductors, L1, and L2. Resistor R1 is bridged by capacitor C1. The output of the hybrid combiner is tied to the casing of the hybrid combiner by capacitor C2. The internal details of the hybrid combiner are shown by way of example only—any hybrid combiner known to those skilled in the art and may be used within the scope of this invention. In a preferred embodiment:

R1 = 100 ohms
L1 = L2 = 124 uH
C1 = 25 pfd
C2 = 50 pfd

In operation, the surface coil is positioned underneath the patient, on the stretcher or bed of an MRI large static magnet. The conductor 12 of coil 11 is placed under the spine of the patient and conductors 23 and 24 of coil arrangement 22 are proximate to the spine within the dimensions of the coil arrangement. Coil 22 has dimensions in a preferred embodiment where legs 23 and 24 are 30 cm long and transverse conductors 26 and 27 are 20 cm long.

The FID signals cut the legs 12, 13 and 14 of coil arrangment 11 and the conductors 23 and 24 of coil arrangement 22 generating currents in those coils. The currents are carried through the coaxial cables 18 and 28 and the hybrid combiner 41 to the preamplifier of the receiver apparatus of the MRI system. The use of the combined coil 11 and 22 where the field generated by one is circular and the field generated by the other is basically normal to the plane of the coil system along with the hybrid combiner 41 provides a relatively inexpensive and highly efficient quadrature surface probe wherein the important conductors are proximate to the section of the body being imaged. The proximity is much greater than in any previous prior art type of surface probe. Thus the shown surface probe is ideal for spinal images. However, it could be used for any other body parts wherein surface coils have been shown to produce better images. The quadrature surface coil arrangement described herein combines the best features of quadrature surface coils along with improved homogenity and the ability of having both coils closer to the body part being imaged than any prior art quadrature surface coil. Both coils of the present quadrature surface coil arrangement are closer to the part of the body being imaged.

While the invention has been described with reference to certain embodiments, it should be understood that the description is made by way of example only and not as the limitation on the scope of the invention.

What is claimed is:

1. A quadrature surface coil arrangement for use in the magnetic resonance (MR) examinations, said surface coil arrangement comprising:
   a first coil means for generating a circular field responsive to currents generated in the first coil means by FID signals in the MR system,
   second coil means proximate to the first coil means for producing a magnetic field aligned normal to the plane of the second coil means at the center of the second coil means responsive to the generation of current induced by said FID signals in the MR system,
   said first coil means comprising:
   a first outer, a second outer and a centrally located longitudinal conductor apart from and parallel to each other,
   a pair of parallel spaced-apart transverse conductors being connected to said first outer, second outer and centrally located longitudinal conductors to form a plurality of loops,
   means for tuning said first coil means,
   means for matching said first coil means,
   said second coil means comprising first and second spaced-apart longitudinal conductors,
   parallel, spaced-apart, transverse conductors connecting said first and second longitudinal conductors of said second coil means to form a single loop,
   means for tuning said second coil means, and
   means for matching said second coil means,
   isolating means in said first coil means and in said second coil means for isolating said first and second coil means from transmissions during radio frequency (RF) pulse transmission in said MR system,
   said isolating means comprising:
   pin diode means and
   means for connecting said pin diode means across said means for tuning said first coil means and said second coil means whereby when RF pulses are being transmitted in said MR system then the said means for tuning said first and second coil means are shorted out by said pin diode means.

2. The quadrature surface coil of claim 1 wherein said first and second coil means are both mounted on opposite sides of the piece of plastic and are thereby separated by the thickness of said piece of plastic.

3. The quadrature surface coil of claim 2 wherein said means for tuning said first coil means and said means for tuning said second coil means comprise capacitor means in each of said longitudinal conductors.

4. The quadrature surface coil arrangement of claim 1 including means for coupling said quadrature surface coil to said MR system.

5. The quadrature surface coil arrangement of claim 4 wherein said means for coupling to the MR system comprises:
   first and second coaxial cable means each having a center conductor and outer shielding,
   means for connecting the center conductor of said first coaxial cable means to said first coil means at the junction point of a first capacitor used for tuning said first coil means and a first matching capacitor serially connected in said third longitudinal conductor of said first coil means,
   means for coupling the shielding of said first coaxial cable to the other side of said matching capacitor, means for connecting the center conductor of said second coaxial cable means to said second coil means at the junction point of a second capacitor used for tuning in said second coil means and a serially connected second matching capacitor in said second coil means.

6. The quadrature surface coil arrangement of claim 5 including hybrid combiner means for connecting said first and second coil means through said first and second coaxial cables to said magnetic resonant MR system.

7. The quadrature surface coil arrangement of claim 6 wherein one of said first and second coaxial cable means includes a quarter wave length section whereby said one of said coaxial cables is longer than said other of said first and second coaxial cables by approximately a quarter wave length.

* * * * *